United States Patent [19]

Reche

[11] Patent Number: 5,024,969
[45] Date of Patent: Jun. 18, 1991

[54] HYBRID CIRCUIT STRUCTURE FABRICATION METHODS USING HIGH ENERGY ELECTRON BEAM CURING

[76] Inventor: John J. Reche, 8039 Agate, Ventura, Calif. 93004

[21] Appl. No.: 484,376

[22] Filed: Feb. 23, 1990

[51] Int. Cl.$^5$ .................... H01L 21/00; H01L 21/02; B05D 3/00; B05D 3/02
[52] U.S. Cl. .................................. 437/173; 437/928; 148/DIG. 46; 430/270
[58] Field of Search .................. 156/643, 655, 659.1, 156/662; 430/270, 272, 296, 314; 437/173, 928; 148/DIG. 46

[56] References Cited

U.S. PATENT DOCUMENTS

| | | | |
|---|---|---|---|
| 4,130,424 | 12/1978 | Feit et al. | 156/901 |
| 4,507,333 | 3/1985 | Baise et al. | 437/235 |
| 4,600,685 | 7/1986 | Kitakohji et al. | 430/270 |
| 4,740,451 | 4/1988 | Kohara | 430/194 |

FOREIGN PATENT DOCUMENTS

| | | |
|---|---|---|
| 0017041 | 2/1981 | Japan . |
| 0056657 | 5/1981 | Japan . |
| 0137348 | 10/1981 | Japan . |
| 0223420 | 12/1984 | Japan . |
| 0119549 | 6/1985 | Japan . |
| 0045045 | 2/1987 | Japan . |

*Primary Examiner*—Brian E. Hearn
*Assistant Examiner*—B. Everhart
*Attorney, Agent, or Firm*—James E. Brunton

[57] ABSTRACT

A method of fabricating high density multi-chip interconnects whereby one or more polymer layers thereon are cured at approximately room temperature utilizing high energy electron bombardment. The polymer layers, typically in the range of five to twenty microns in thickness, cured in accordance with the present invention, have very low ambiant temperature interlayer stresses, resulting in higher reliability and/or a wider operating temperature range for the finished high density multi-chip interconnect. In addition, curing times are grossly reduced, thereby making the manufacturing processing much more orderly and rapid. Interlayer adhesion of polymer layers cured in accordance with the present invention may be enhanced by the baking of the same at an elevated temperature below the glass transition temperture for the polymer. Various methods and parameters are disclosed.

8 Claims, 1 Drawing Sheet

HYBRID CIRCUIT STRUCTURE FABRICATION METHODS USING HIGH ENERGY ELECTRON BEAM CURING

BACKGROUND OF THE INVENTION

1. Field of the Invention

The present invention relates to the field of hybrid circuits, and more particularly to high density multichip interconnect circuits for interconnecting unpackaged integrated circuits.

2. Prior Art

Recently, considerable interest has developed in forming multi-chip modules wherein a plurality of integrated circuits in chip form are mounted on a substrate and interconnected to provide the functions of Ultra Large Scale Integration (USLI) and higher integration without the normally associated problems thereof. Such interconnecting devices, sometimes referred to as high density multi-chip interconnects (HDMI), allow the testing of individual integrated circuits before mounting, thereby eliminating the need for redundancy for suitable yields. This can allow closer connection of the functional blocks on the HDMI than could be achieved in a corresponding single chip device. It also results in a faster circuit by reducing parasitic capacitance, and can eliminate the need for on-chip line drivers sometimes required on large single chip integrated circuits because of the long interconnect lines. It reduces costs by allowing testing of the integrated circuit functional blocks and the elimination of only the bad ones before using the same in the HDMI, and of course allows one to obtain the advantages of wafer scale integration without the attendant problems thereof even in applications wherein the market volume for the product is too small to consider larger scale or wafer scale integration.

At the present time, HDMI technology is somewhat of a mix, in some ways resembling integrated circuit fabrication techniques and in other ways somewhat resembling printed circuit board fabrication techniques. By way of example, conductor line widths are beginning to approach those used in at least older integrated circuit designs, and bonding techniques used to interconnect the chips to the HDMI are those typically used in conventional integrated circuit packaging. On the other hand, the materials used for the insulative layers, typically polymers, and the number of cross-overs typically required are more similar to that found in printed circuit board fabrication, as opposed to the silicon-oxide layer and the deposited metal interconnect layer of typical integrated circuits. Because of the varied materials used and the wide range of properties thereof, such structures may encounter problems regarding adhesion between layers, and stability and reliability of the interconnect, particularly when cycled over a large temperature range such as may be encountered in various ordinary applications for such devices.

In certain other prior art applications, thin layers of polymer have been cured by the bombardment thereof with high energy electrons. Such layers typically have been of a thickness of the order of 2,000 angstroms, very much thinner than that commonly used in HDMI construction.

BRIEF SUMMARY OF THE INVENTION

A method of fabricating high density multi-chip interconnects whereby one or more polymer layers thereon are cured at approximately room temperature utilizing high energy electron bombardment. The polymer layers, typically in the range of five to twenty microns in thickness, cured in accordance with the present invention, have very low ambient temperature interlayer stresses, resulting in higher reliability and/or a wider operating temperature range for the finished high density multi-chip interconnect. In addition, curing times are grossly reduced, thereby making the manufacturing processing much more orderly and rapid. Interlayer adhesion of polymer layers cured in accordance with the present invention may be enhanced by the baking of the same at an elevated temperature below the glass transition temperature for the polymer. Various methods and parameters are disclosed.

DETAILED DESCRIPTION OF THE INVENTION

Figure 1:
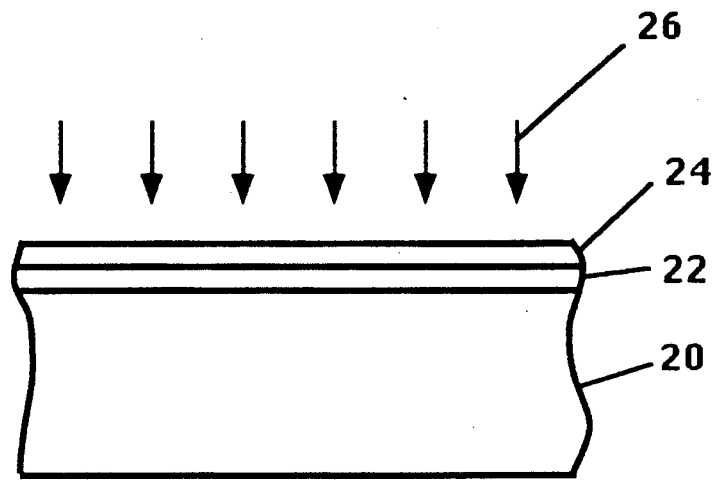
FIG. 1 is a schematic cross section of a typical substrate at an early stage of fabrication of a high density multi-chip interconnect.

First referring to FIG. 1, a section of a high density multi-chip interconnect representing an early stage in the fabrication thereof may be seen. The interconnect structure is fabricated on a substrate 20 of appropriate size and thickness. Such substrates may be any of various metals, a semiconductor, typically silicon, or an insulator such as a ceramic as desired. In the case of a semiconductor substrate or an insulative substrate for substrate 20, fabrication of a high density multi-chip interconnect will normally begin with the deposition of a metal layer 22 to provide a ground plane for the interconnect circuitry to be formed thereabove. Thereafter, a polymer layer 24 is put down and cured, thereby forming an insulative layer between the ground plane 22 and the circuit to be formed thereover. In a preferred embodiment of the present invention, the polymer layer 24 is a polyimide layer, though other polymers may also be used.

In the prior art, polymer layers such as layer 24 have been cured in the conventional manner, namely heating of the substrate and thus the layer to an appropriate curing temperature for a sufficient period of time for curing to be achieved. In accordance with the present invention however, the substrate and thus the polymer layer is maintained substantially at room temperature, and the polymer layer 24 is exposed to (bombarded by) high energy electrons at or near the x-ray region in a vacuum. Preferably, the energy of the electrons is in the region of 5 to 30 kilovolts, for 1 to 120 seconds depending on material thickness, with a total dosage of up to approximately 1 millicoulombs per square centimeter in curing depending on the thickness of the layer. In that regard, the thicknesses of polymer layers typically used for high density multi-chip interconnects are generally in the range of approximately five to twenty microns, and accordingly the exposure may be varied to accommodate the different thicknesses of the polymer used. With this curing, the temperature rise during curing typically is less than 5 c during the electron beam exposure.

The advantage of using the high energy electron curing in the fabrication of the high density multi-chip interconnect of the present invention is that the same allows the curing of the polymer in approximately one minute, rather than the matter of hours commonly used in the prior art, thereby allowing a more orderly and rapid manufacturing process. Further, since the curing is effectively carried out at room temperature, the stresses in the cured polymer layer are negligible at room temperature. Since in many applications, room temperature represents approximately mid-range of the expected operating temperature range of the interconnect, the same normally represents an ideal minimal stress condition for the device. In that regard, as used herein and in the claims, the phrase "room temperature" means a temperature convenient and comfortable to workers in a normal manufacturing environment, such as in the range of 65 to 80 degrees Fahrenheit. In that regard also, while the curing of the polymer layer by exposure to high energy electrons is conveniently carried out at room temperature, the same could be carried out at higher or lower temperatures to establish higher or lower minimal stress temperatures, respectively, if for instance, finished device is to only be exposed to temperatures ranging from ordinary temperatures upward, or alternatively, ordinary temperatures downward. Thus the curing temperature can be adjusted to equalize the temperature induced stresses while going across the full exposure temperature range.

The foregoing is to be compared with the prior art elevated temperature curing of the polymer layers in a high density multi-chip interconnect wherein the minimal stress temperature for the cured polymer layer is the curing temperature for the layer, limited in the upper value by the glass transition temperature for the polymer. In particular, if curing is carried out at a temperature lower than the glass transition temperature, then the curing temperature represents the minimal stress temperature, whereas if curing is carried out above the glass transition temperature for the polymer, the glass transition temperature itself represents the minimal stress condition for the polymer layer, as the polymer layer will not support stresses above that temperature. In either event however, the minimal stress temperature in the prior art is normally well above the highest expected operating or exposure temperature for the high density multi-chip interconnect, resulting in high stresses even at room temperature and very high, sometimes fatal stresses (excessive warpage of the substrate or actual material failure) at lower temperatures within the expected exposure and/or operating temperature range of the device. Accordingly, the present invention grossly alleviates problems with the prior art, even for polymers used in the prior art, and makes potentially usable, polymers which have a number of desired characteristics but could not be used in the prior art because of the stress problems associated therewith. By way of example, the present invention raises the possibility of using materials which are too rigid (high modulus) for standard thermal curing processes and still staying well within a tolerable shear stress over the required temperature range. For example, some polyimides, epoxy polyimides and fluorinated polyimides have a high modulus and therefore are unusable with thermal curing. Such materials may be desirable, however, because of other characteristics such as lower dielectric constants or lower moisture absorption. With the electron beam curing, very rigid polymers and polymers having a larger coefficient of thermal expansion mismatch with the substrate and/or metals used may be used while retaining the integrity of the assembly as long as the product of the differences in the temperature coefficient of expansions times the temperature excursion from the minimum stress temperature remains acceptable.

Obviously, while the present invention can extend the useful temperature range of a high density multichip interconnect over the same type of structure fabricated in accordance with the prior art, it also makes interconnects operating over the same temperature range as prior art devices much less susceptible to interlayer separation because of the lower interlayer shear stresses, much less susceptible to failure due to repeated temperature cycling, and overall, much more reliable as a result.

Figure 2:
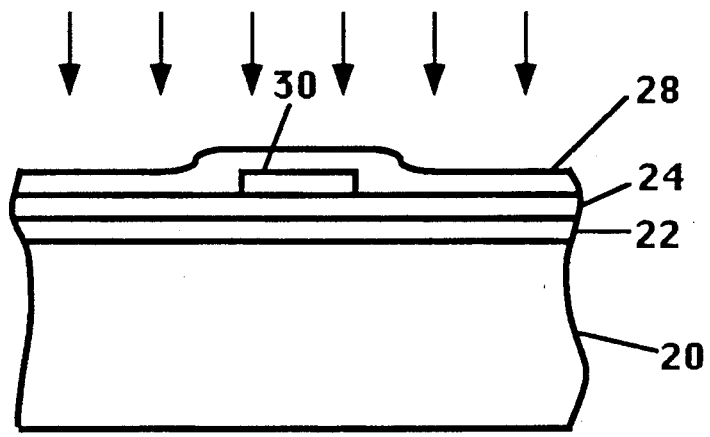
FIG. 2 is a schematic cross section similar to FIG. 1 at a later stage of fabrication of a high density multi-chip interconnect.

In the fabrication sequence of a normal high density multi-chip interconnect, insulative layer 24 is covered with a metal layer, which is turn is masked and etched to form the patterned conductive interconnect layer, or one of the patterned conductive layers, thereby forming for instance, a conductor 28 as shown in FIG. 2. This layer is again covered with a polymer layer 30, with any additional conductive layers and insulative layers being formed thereover by repeating the sequence of steps resulting in the first patterned conductive layer 28 (terminal pads, crossovers, etc. may be formed in a conventional manner which, since the present invention is peripheral thereto, are not described in detail herein). Obviously, the polymer layer 30 as well as any other additional polymer layers may also be cured in the same manner as hereinbefore described with respect to polymer layer 24, as may any subsequent polymer layers in the structure of the high density multi-chip interconnect.

In general, the adhesion between the polymer layers such as layers 24 and 30, and the adhesion of the polymer to a metalized layer such as a metalized layer 28, when using the curing technique of the present invention, is good. On the other hand, in some instances, a polymer layer cured with high energy electron bombardment does not adhere to the neighboring layer as well as desired. By way of specific example, if the substrate 20 is a silicon substrate, in accordance with common processing, the surface of the substrate is provided with a layer of silicon dioxide before the ground plane layer 24 is deposited. The ground plane layer 24 in turn may be left as a uniform layer, or may be patterned as desired, effectively forming a screen type ground plane. If patterned, then the polymer layer 24 and the silicon dioxide layer on the substrate will be adjacent layers over some percentage of the substrate. It has been found that the adhesion of a polyimide to a silicon dioxide layer when cured with high energy electrons is substantially less than desired.

It has also been found however, that heat treating the assembly or sub-assembly by baking the same at an elevated temperature below the glass transition temperature substantially enhances the adhesion without significantly changing the temperature of the minimal polymer layer stress (typically room temperature in accordance with the present invention). Obviously of course, if the interconnect assembly or sub-assembly is heated to above the glass transition temperature then the stresses will be relieved at the elevated temperature, resulting in the stresses building as the same cools through the glass transition temperature, resulting in high stresses characteristic of the prior art at room temperature again. As an example of the desired heat treatment, a polymer having a glass transition temperature of 340 degrees centigrade might be heat treated for adhesion enhancement by baking the same at temperatures ranging from 100 degrees centigrade to 300 degrees centigrade. This heat treatment process may be carried out after the curing of each polymer layer by high energy electron bombardment, though preferably is done as a one step process after the fabrication of the interconnect is complete (but generally prior to the mounting of the IC's, etc., to the interconnect and the lead bonding is undertaken), as the elimination of the high temperature curing of the polymer layers essentially allows fabrication of the complete interconnect at or near room temperature, and thus without significant differential expansion induced stresses, making it unnecessary to achieve full adhesion characteristics until just prior to lead wire bonding and use of the interconnect.

Thus, while the present invention has been disclosed and described with respect to preferred embodiments thereof, it will be understood that the methods and structures of the present invention may be varied without departing from the spirit and scope thereof.

I claim:

1. A method of fabricating a high density multichip interconnect having interconnect circuitry over a first surface of a substrate, the high density multichip interconnect having at least one cured polymer insulator layer in the structure thereof formed over a partially fabricated high density multichip interconnect, the method including the following steps of forming the cured polymer insulator layer:

(a) coating the partially fabricated high density multichip interconnect with a layer of uncured polymer;

(b) curing the polymer layer of step (a) by bombarding the same with high energy electrons; and (c) wherein step (b) is performed at room temperature for approximately 1 to 120 seconds with the energy of the electrons in the region of 5 to 30 kilovolts.

2. The method of claim 1 further comprised of the step of exposing the polymer layer to an elevated temperature below the glass transition temperature of the polymer for at least a predetermined time.

3. The method of claim 2 wherein the polymer layer is exposed to the elevated temperature below its glass transition temperature following step (c).

4. The method of claim 2 wherein the polymer layer is exposed to the elevated temperature below the glass transition temperature at a later stage of fabrication of the high density multichip interconnect.

5. The method of claim 2 wherein the step of exposing the polymer layer to an elevated temperature below the glass transition temperature of the polymer for at least a predetermined time comprises exposing the polymer layer to a temperature of approximately 100 degrees centigrade.

6. The method of claim 1 wherein the high density multichip interconnect has a plurality of cured polymer layers formed in accordance with the method.

7. The method of claim 1, 2, 3, 4 or 5 wherein step (a) comprises the step of coating the partially fabricated high density multichip interconnect with a layer of uncured polymer of a predetermined thickness, whereby upon curing, the cured polymer layer will have a thickness in the range of approximately 5 to 20 microns.

8. The method of claim 7 wherein the high density multichip interconnect has a plurality of cured polymer layers formed in accordance with the method.

* * * * *